(12) United States Patent
Pathak et al.

(10) Patent No.: US 11,444,210 B2
(45) Date of Patent: Sep. 13, 2022

(54) ON-CHIP POWER SUPPLY NOISE SUPPRESSION THROUGH HYPERABRUPT JUNCTION VARACTORS

(71) Applicant: Drexel University, Philadelphia, PA (US)

(72) Inventors: Divya Pathak, Philadelphia, PA (US); Ioannis Savidis, Wallingford, PA (US)

(73) Assignee: Drexel University, Philadelphia, PA (US)

( * ) Notice: Subject to any disclaimer, the term of this patent is extended or adjusted under 35 U.S.C. 154(b) by 54 days.

(21) Appl. No.: 16/448,019

(22) Filed: Jun. 21, 2019

(65) Prior Publication Data
US 2019/0393360 A1 Dec. 26, 2019

Related U.S. Application Data

(60) Provisional application No. 62/688,022, filed on Jun. 21, 2018.

(51) Int. Cl.
*H01L 29/93* (2006.01)
*H01L 23/66* (2006.01)
(Continued)

(52) U.S. Cl.
CPC ............. *H01L 29/93* (2013.01); *H01L 23/66* (2013.01); *H01L 27/0676* (2013.01);
(Continued)

(58) Field of Classification Search
CPC ..... H01L 29/66; H01L 29/93; H01L 27/0676; H01L 28/10; H01L 28/40
See application file for complete search history.

(56) References Cited

U.S. PATENT DOCUMENTS

| 6,069,521 A | 5/2000 | Taylor et al. |
| 6,504,443 B1 * | 1/2003 | Eguizabal ............... H03J 3/185 331/177 V |

(Continued)

FOREIGN PATENT DOCUMENTS

WO 02/093341 A3 10/2003

OTHER PUBLICATIONS

Pathak et al., "On-Chip Power Supply Noise Suppression Through Hyperabrupt Junction Varactors", IEEE transactions on very large scale integration (VLSI) systems, vol. 26, No. 11, Nov. 2018, pp. 2230-2240.

*Primary Examiner* — Dale E Page
*Assistant Examiner* — Quovaunda Jefferson
(74) *Attorney, Agent, or Firm* — Schott, P.C.

(57) ABSTRACT

The increasing power density and, therefore, current consumption of high performance integrated circuits (ICs) results in increased challenges in the design of a reliable and efficient on-chip power delivery network. In particular, meeting the stringent on-chip impedance of the IC requires circuit and system techniques to mitigate high frequency noise that results due to resonance between the package inductance and the onchip capacitance. In this paper, a novel circuit technique is proposed to suppress high frequency noise through the use of a hyperabrupt junction tuning varactor diode as a decoupling capacitor for noise critical functional blocks. With the proposed circuit technique, the voltage droops and overshoots on the onchip power distribution network are suppressed by up to 60% as compared to MIM or deep trench decoupling capacitors of the same capacitance. In addition, there is no added latency to react to power supply noise and there is no degradation to circuit performance as compared to existing techniques in commercial products and literature.

6 Claims, 14 Drawing Sheets

(51) Int. Cl.
*H01L 49/02* (2006.01)
*H01L 27/06* (2006.01)

(52) U.S. Cl.
CPC .............. *H01L 28/10* (2013.01); *H01L 28/40* (2013.01); *H01L 2223/6666* (2013.01)

(56) References Cited

U.S. PATENT DOCUMENTS

| | | |
|---|---|---|
| 6,509,785 B2 | 1/2003 | Ang et al. |
| 6,559,024 B1 * | 5/2003 | Boles .................. H01L 29/93 257/52 |
| 8,879,223 B2 * | 11/2014 | Wang .................. H02H 9/044 361/56 |
| 9,806,707 B2 | 10/2017 | Li |
| 2002/0145475 A1 * | 10/2002 | Fenton ................ H03B 5/1841 331/25 |
| 2010/0059860 A1 * | 3/2010 | Liu .................... H01L 29/66174 257/596 |

\* cited by examiner

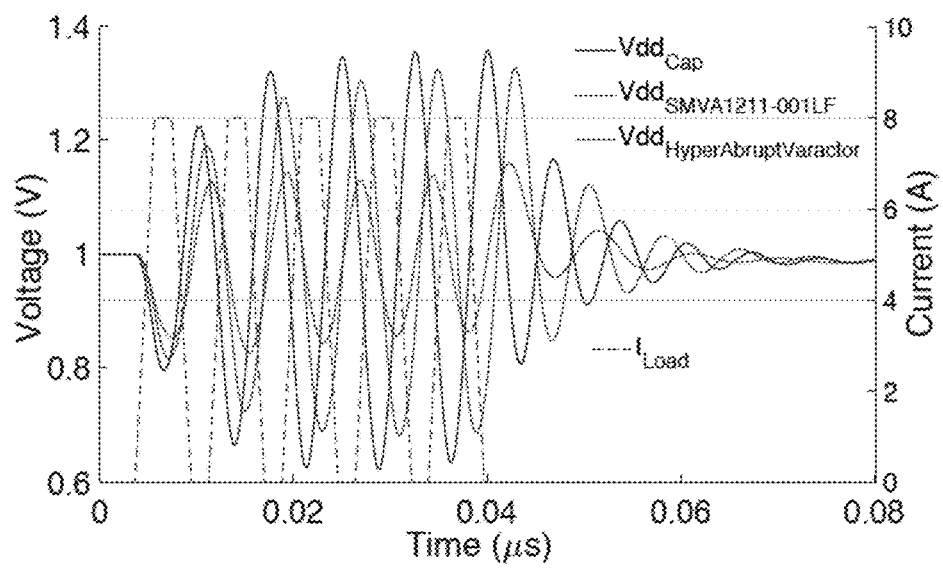
Fig. 14
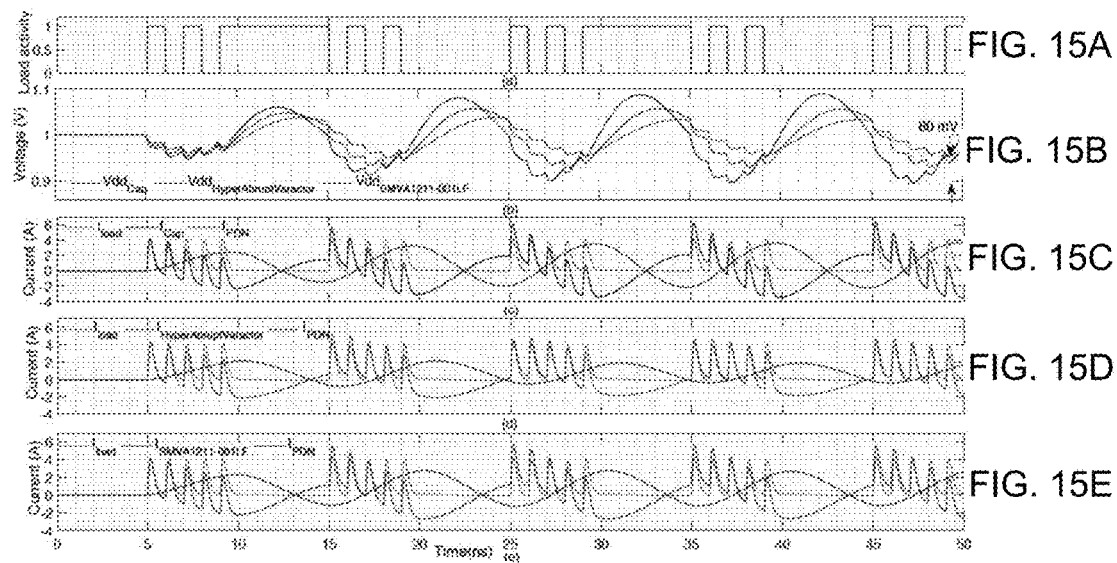

TABLE IV
CHARACTERIZATION OF LEAKAGE CURRENT, CAPACITOR DENSITY, AND TEMPERATURE STABILITY FOR DIFFERENT FAMILIES OF CAPACITORS

| Capacitor type | Leakage current (A/μm²) | Capacitor density (fF/μm²) | Temperature stability (ppm/°C) |
|---|---|---|---|
| CMOS Decap (65 nm process) [26] | $10^{-9}$ | 6.6 | 50 to 100 |
| 2.5 V NMOS thick oxide decap (65 nm process) [26] | $10^{-8}$ | 3.7 | 50 to 100 |
| MIM decap | $10^{-12}$ [27] | 0.58 to 1.1 [27], [28] | 35 [28] |
| Deep trench | $<10^{-15}$ for MIMMIM deep trench [30] | 158 (65 nm process), >400 in 32 nm and below [30], [31] | not provided |
| Hyperabrupt junction diode | $10^{-10}$ to $10^{-7}$ at $V_R = 1$ V, $T = 25$ °C [31] | 400 (65 nm process) at $V_R = 1$ V, $T = 25$ °C [21] | 100 to 300 [1] |

ON-CHIP POWER SUPPLY NOISE SUPPRESSION THROUGH HYPERABRUPT JUNCTION VARACTORS

STATEMENT REGARDING GOVERNMENT SUPPORT

This invention was made with government support under Contract No. CNS-1648878 awarded by the National Science Foundation. The government has certain rights in the invention.

BACKGROUND

Robust and efficient on-chip power delivery is a challenge with increasing transistor density due to scaling and limited temperature and power budgets. The on-chip power integrity is maintained through significant voltage margins to negate any timing violations that occur due to large and fast power supply transients. The primary cause of transient noise on the on-chip power supply rail in digital circuits is a sudden change in circuit activity, which leads to a surge in the on-chip current consumption. The DC-DC voltage regulator that supplies current through a passive power delivery network (PDN) lags when responding to sudden changes in current demand. The integrated decoupling capacitors (decap) provide additional charge when required by the load circuits. Due to limitations in on-chip area, locations for placement, and leakage current through the decaps, the on-chip capacitance is optimized to supply a limited amount of charge until the current through the inductive PDN increases to meet the load current demand. Additional power supply noise mitigation techniques may be needed to minimize voltage droops especially the high frequency noise (less than 10 ns) that is attributed to the resonance between the on-chip capacitance and the inductance of the package leads. For substantial voltage margin reduction, any high frequency noise mitigation technique must provide sub-nanosecond response time. Since the noise mitigation circuits are designed in the same technology node and operate at a similar clock frequency as the load circuits, the latency to detect and react to high frequency noise events is significant (greater than 2 ns).

SUMMARY OF THE EMBODIMENTS

Herein, an on-chip hyperabrupt junction diode, which is a voltage dependent capacitive structure, is described for power supply noise suppression. The variable capacitance of the device is exploited to suppress power supply undershoots and overshoots. Detailed power supply noise simulations are performed on an optimized PDN to study the on-chip voltage behavior while using hyperabrupt junction varactors as decoupling capacitors.

BRIEF DESCRIPTION OF THE DRAWINGS

FIG. 14 shows voltage droop on the optimized PDN due to load activity at a resonant frequency of 50 MHz.

FIGS. 15A-15D show on-chip voltage and current response to resonant load activity at 100 MHz, which matches the impedance peak resonance of the switched capacitor load circuit: 15A—Bit pattern controlling the switched capacitor load circuit, 15B—Characterization of the voltage noise on the PDN for the three on-chip capacitor configurations. Characterization of the current response on the on-chip PDN for the 15C ideal, 15D—series-connected Verilog-A model of the hyperabrupt varactor, and 15E—SMVA1211-001LF configurations of the on-chip capacitance.

FIG. 17 shows Table IV.

DETAILED DESCRIPTION OF THE EMBODIMENTS

I. Introduction

This is organized as follows. The operation and modeling of hyperabrupt junction diodes is described in Section II. A description of power supply noise generated by synchronous digital blocks and the mitigation of the noise through the use of hyperabrupt junction diodes is provided in Section III. A detailed analysis of the power supply noise with a characterization of the transient and frequency domain responses of the PDN is described in Section IV. The benefits of using hyperabrupt junction diodes to suppress on-chip digital noise in comparison to existing on-chip power supply noise mitigation techniques are discussed in Section V. Concluding remarks are provided in Section VI.

II. Hyperabrupt Junction Varactor Diode

A reverse-biased P-N junction diode may act as a voltage-controlled capacitor. An applied reverse bias voltage VR may control the thickness of a depletion region, which in turn determines the junction capacitance. The capacitance of the junction is inversely proportional to the thickness of the depletion region. P-N junction diodes, which exhibit low losses at microwave frequencies, may be manufactured with a controlled doping profile to enhance the variation of the junction capacitance with the applied reverse bias voltage. The diodes, also referred to as varactors, have been extensively used as radio frequency translation devices. The large tuning ratio of the capacitance, with moderate costs in linearity and quality factor, may make hyperabrupt varactors suitable for many frequency tuning applications as well as more common circuit applications such as voltage-controlled oscillators, phase shifters, and frequency multipliers.

Figure 1A:
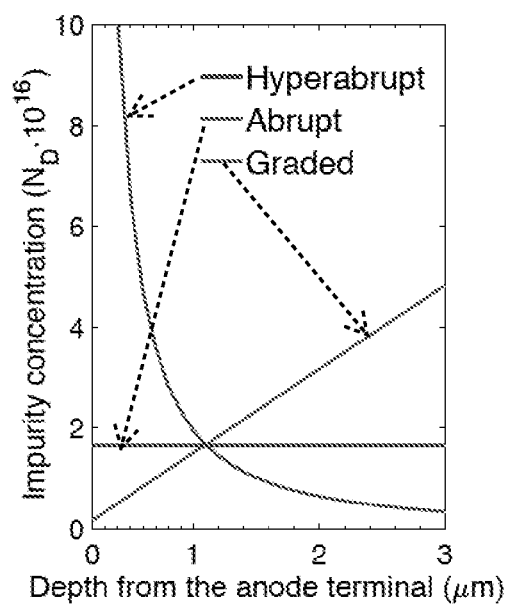
FIGS. 1A and 1B show Characterization of different grading coefficients on 1A variation in the doping concentration on the n-side of a p+/n junction and 1B capacitance variation with the applied reverse bias voltage VR.

A varactor diode may generally include a junction with a heavily doped P side. The variation of the doping concentration on the N side sets the feasible capacitance range of the varactor as a function of the reverse bias voltage. The ideal doping profiles of three P+/N junctions may be shown in FIG. 1A. The doping concentration on the P+ side is a constant (N=Na).

The doping concentration on the N side is mathematically expressed as Nd α x^-m for x>0, where x is the distance from the junction and m is a constant that describes the type of P-N junction. For an abrupt varactor and linearly graded varactor, m is 0 and 1, respectively. The m value for a hyperabrupt varactor is typically between −1.2 to −2, as there is a rapid reduction in the charge concentration as the distance from the junction increases. The result is a retrograde dopant profile, with the dopant concentration exhibiting a steep slope near the diffusion region. Complex fabrication techniques with multiple diffusion and/or implantations may be used to produce the steep doping profiles needed for hyperabrupt varactors. The nonidealities due to the diffusion process result in varying diffusion coefficients that are dependent on the doping concentration. Hyperabrupt junction varactors have been successfully fabricated in integrated circuits based on silicon (bulk CMOS), gallium arsenide, and SOI substrates, which ensures compatibility with advanced technology nodes.

Figure 1B:
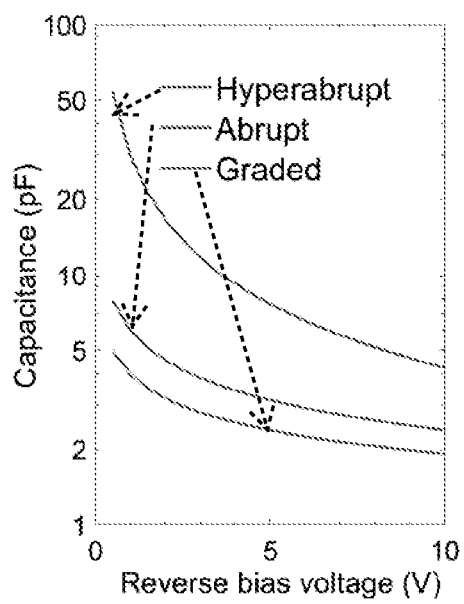

As shown in FIG. 1B, the hyperabrupt varactor offers a great variation in capacitance with an applied reverse bias voltage as compared to an abrupt or graded varactor. For frequency tuning applications, a high capacitance ratio is desired along with high linearity and a large quality factor. Due to limitations in CMOS fabrication processes, it is challenging to simultaneously enhance the tunability, linearity, and quality factor of varactors, which implies tradeoffs between the three parameters are necessary when optimizing the hyperabrupt junction. The quality factor is improved by minimizing the series resistance, which is controlled by the thickness of the epitaxial layer. For decoupling capacitance in digital ICs, the important parameter is to provide a high tunability of the capacitance. Through optimization in the fabrication process, it is feasible to obtain a high capacitance ratio with moderate linearity and a low quality factor.

A. Modeling of a Hyperabrupt Junction Varactor

Figure 2:
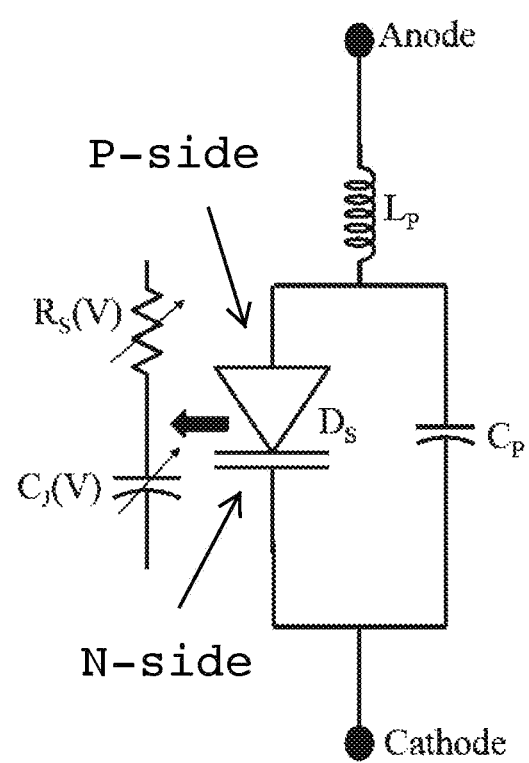
FIG. 2 shows a circuit schematic of a hyperabrupt varactor diode.

FIG. 2 shows the electrical model of the hyperabrupt junction varactor. The diode DS is modeled as a variable junction capacitance CJ (V) and a variable series resistance RS(V). The series inductance of the diode may be negligible.

The parasitic impedance of the package and off-chip interconnects connecting the discrete diode may include a series resistance (negligible), parasitic inductance (negligible), and parasitic capacitance CP. Herein, an on-chip implementation of the hyperabrupt varactor is considered instead of a discrete packaged component. Therefore, the on-chip interconnect is modeled as a parasitic inductance LP and capacitance CP as shown in FIG. 2.

The junction capacitance is a function of the applied reverse bias voltage and is mathematically represented by Equation (1). The junction capacitance at zero reverse bias voltage is CJ0, and VJ is the junction potential. For silicon, the built-in potential for a P-N junction is 0.47 V under zero bias voltage. The doping profile on the N side of the diode is expressed through the grading coefficient M. Since hyperabrupt varactor diodes may exhibit a complex doping profile, the variation of the capacitance with reverse bias voltage is modelled through a curve fitting technique based on (1). The values of VJ and M are, therefore, much higher than that explained through physical properties alone. The three parameters CJ0, VJ, and M are defined relative to each other to satisfy the experimentally observed variation in junction capacitance with the applied reverse bias voltage and are obtained through curve fitting the disparate pieces of the measured C-V curve of the varactor.

$$C(V) = C_{J0} \cdot \left(1 + \frac{V}{V_J}\right)^{-M} \quad (1)$$

The capacitance of a varactor diode is directly proportional to the operating temperature. The empirical formula for the temperature coefficient of capacitance (ppm change in capacitance per ° C. change in temperature) is given by Equation (2), where K is a constant and Γ(V) is a function of the reverse bias voltage. Therefore, the greater the tuning ratio of the capacitance, the larger the variation in capacitance with temperature. Most commercially available hyperabrupt varactor diodes exhibit a capacitance variation of 2% for a temperature range of −40° C. to +80° C.

$$T_c(V) = K \cdot \Gamma(V) \cdot 10^6 \quad (2)$$

The applicability of hyperabrupt junction varactors as decoupling capacitors for CMOS integrated circuits may now be discussed. The operation of the varactor with an applied DC reverse bias voltage in the sub-volt range (the nominal power supply voltage for a sub 45 nm technology) may be considered using a SPICE model of a commercially available hyperabrupt varactor diode with a large capacitance tuning ratio is developed and used to analyze power supply noise suppression. The SPICE model parameters for the SMA1211001LF diode from Skyworks Solutions Inc. are listed in Table I. The capacitance of the SMVA1211-001LF changes by 64 pF as the reverse bias voltage is changed from 1 V to 0 V. A set of 515 SMVA1211-001LF varactors, each represented as a SPICE equivalent model, are connected in parallel to construct a varactor model with a zero-bias junction capacitance CJ0 of 84 nF.

TABLE I

SPICE model parameters for the hyperabrupt varactor diode SMVA 001LF [13].

| Parameter | Value |
|---|---|
| Zero-bias junction capacitance, $C_{J0}$ | 163 pF |
| Junction potential, $V_J$ | 200 V |
| Grading coefficient, M | 130 |
| Energy gap, $E_G$ | 1.11 eV |
| Saturation current temperature exponent, $X_{TI}$ | 3 |
| Saturation current, $I_S$ | 10 aA |
| Series resistance, $R_S$ | 0.4 Ω |
| Emission coefficient, N | 1 |
| Flicker noise exponent, $A_F$ | 1 |
| Forward-bias depletion capacitance coefficient, $F_C$ | 0.5 |
| Reverse breakdown voltage, $B_V$ | 12 V |
| Current at reverse breakdown voltage, $I_{BV}$ | 1 mA |
| Recombination current parameter, $I_{SR}$ | 0 A |
| Emission coefficient for ISR, $N_R$ | 2 |
| High-injection knee current, $I_{KF}$ | 0 |
| Reverse breakdown ideality factor, $N_{BV}$ | 1 |
| Low-level reverse breakdown knee current, $I_{BVL}$ | 0 |
| Low-level reverse breakdown ideality factor, $N_{BVL}$ | 1 |
| Flicker noise frequency exponent, $F_{FE}$ | 1 |
| Nominal ambient temperature at which the model parameters are derived, $T_{NOM}$ | 27° C. |

Figure 3A:
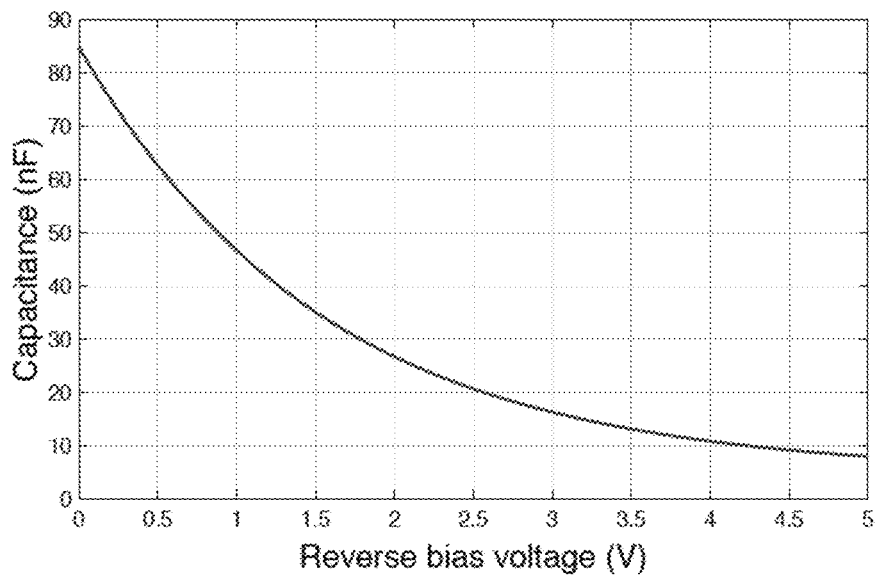
FIGS. 3A and 3B show SPICE simulations of a hyperabrupt junction varactor based on the Skyworks SMA1211-001LF diode characterizing 3A capacitance as a function of reverse bias voltage and 3B insertion loss (S21) and return loss (S11) from 0 to 5 GHz.
Figure 3B:
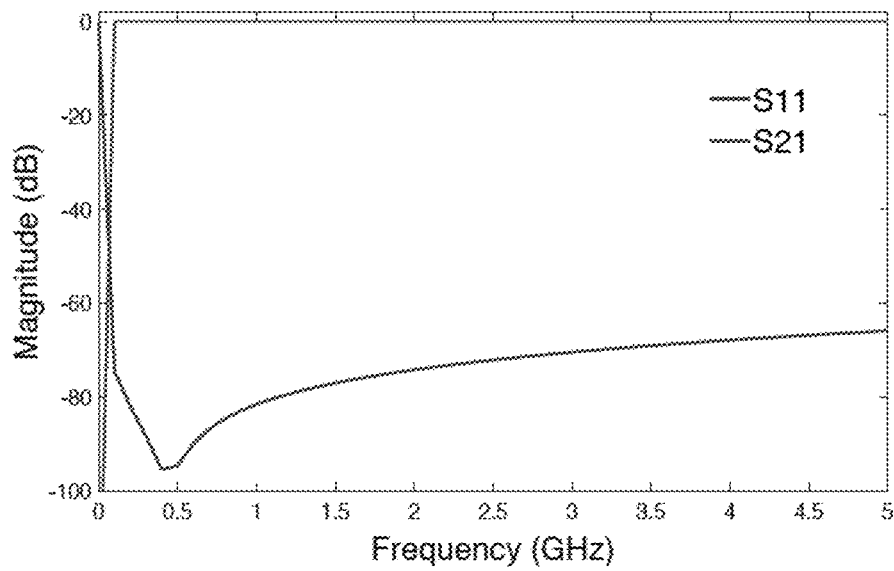

FIG. 3A shows the variation in the junction capacitance of the constructed model of the hyperabrupt varactor with an applied reverse bias voltage. The hyperabrupt varactor capacitance at a reverse bias voltage of 1 V is 48.45 nF. An analysis of S-parameters for a reverse bias voltage of 0 and 1 V is also performed on the SPICE model of the hyperabrupt varactor. The insertion loss (S21) and the return loss (S11) of the hyperabrupt varactor across a frequency range of 0 to 5 GHz is shown in FIG. 3B. As no difference in the S21 and S11 was evident between a reverse bias voltage of 0 V and 1 V, only the results for the 1 V analysis are included in FIG. 3B. The insertion loss profile of the hyperabrupt varactor is identical to a standard decoupling capacitor. Across the typical range of operating frequencies for a digital CMOS circuit, there is no attenuation of the signal across the ports of the hyperabrupt varactor. The SPICE model of the hyperabrupt varactor is used to characterize the suppression of power supply noise described in Section III-B and IV. In addition, a Verilog-A model of the hyperabrupt varactor diode is developed to describe the design space with respect to CJ0, VJ, and M.

III. Transient Noise in on-Chip Power Supply Networks

In this section, power supply voltage variation in CMOS circuits is described. In addition, the behavior of a hyperabrupt varactor diode as an on-chip decoupling capacitor to suppress power supply noise is explored.

A. Clock-Edge Induced Power Supply Noise

In a synchronous digital system, the activity of a CMOS circuit is driven by the clock signal. The instantaneous sinking of charge on the clock edge gives rise to an impulse of load current, which results in a voltage change across the inductive path (L×dI/dt) of the power distribution network connecting the load circuit to the voltage regulator. Due to the latency of the rate of change of current through the inductance, the current provided through the PDN does not meet the instantaneous impulse load current demand.

Significant work has been completed on decoupling capacitor optimization to limit power supply noise. Decoupling capacitors act as local charge reservoirs that meet the instantaneous charge requirement of the load circuit. The voltage across the decoupling capacitor drops, however, in proportion to the ratio of the charge pulled for the capacitor and the total capacitance, which leads to a voltage droop on the power delivery network (PDN). The impulse of total charge consumed on the clock edge in a CMOS circuit is, therefore, the fundamental cause of the variation in the power supply voltage. The voltage droop is reduced by increasing the value of the decoupling capacitance, but at the cost of increased area and greater leakage current from the charging and discharging of the larger on-chip capacitance.

A switched capacitor load model (refer to FIG. 4) is developed to characterize the clock edge induced power supply noise on the PDN and the behavior of the instantaneous current provided by the on-chip decoupling capacitance. The load model may emulate CMOS circuit behavior and provides an accurate representation of the voltage variation on the PDN connecting the on-chip capacitance and circuit loads. The variation in load current results in simultaneous changes in PDN voltage, which is not feasible with load current models using ideal constant current sources.

The parameters used to model and simulate the switched capacitor load are listed in Table II.

TABLE II

| Parameters used to simulate the switched capacitor load circuit [2]. | |
|---|---|
| Parameter | Value |
| Power supply voltage, $V_{DD}$ | 1 V |
| PDN characteristic impedance, $Z_0$ | 32 mΩ |
| PDN target impedance, $Z_{target}$ | 32 mΩ |
| PDN loop inductance, $L_{PDN}$ | 50.7 pH |
| PDN loop resistance, $R_{PDN}$ | 5.1 mΩ |
| Clock frequency, $f_{clock}$ | 1 GHz |
| On-chip capacitance, $C_{ODC}$ | 50 nF |
| On-chip resistance due to metallization, $R_{ODC1}$ | 3 mΩ |
| On-chip resistance due to MOSFET transconductance and signal wiring, $R_{ODC2}$ | 2 mΩ |
| Current consumed per clock cycle | 1.55 A |
| Capacitive load switching per clock cycle, $C_{Load}$ | 1.55 nF |
| Inductance controlling charging of $C_{Load}$, $L_T$, $R_T$ | 6.7 pH, 80.65 mΩ |

An ideal 1 V (VDD) voltage regulator provides current through a PDN modeled with a single impedance peak attributed to the package loop inductance, package series resistance, on-chip capacitance, and load circuit. The target impedance of the PDN is chosen to equal the characteristic impedance for a dynamic current load $I_{dynamic}$ of 1.55 A consumed per clock cycle. At a clock frequency $f_{clock}$ of 1 GHz, the charge consumed on each rising and/or falling edge of the clock is 1.55 nC, as given by Equation (3). The amount of load capacitance CLoad charged and discharged on each clock cycle for a circuit operating at 1 V is therefore 1.55 nF, as given by Equation (4). The interconnect inductance Lτ along with the corresponding interconnect resistance Rτ determine the charge rate of CLoad over the entire clock cycle. The interconnect resistance for the given load capacitance is chosen such that the Rτ CLoad time constant τ is one fourth the clock period to ensure that the current impulse is distributed across the entire single clock cycle. The total on-chip capacitance CODC is 50 nF. Therefore, the intentional on-chip decoupling capacitance is the difference between CODC and CLoad.

$$Q_{clk\text{-}edge} = \frac{I_{dynamic}}{f_{clock}} \tag{3}$$

$$C_{Load} = \frac{Q_{clk\text{-}edge}}{V_{DD}} \tag{4}$$

Figure 5A:
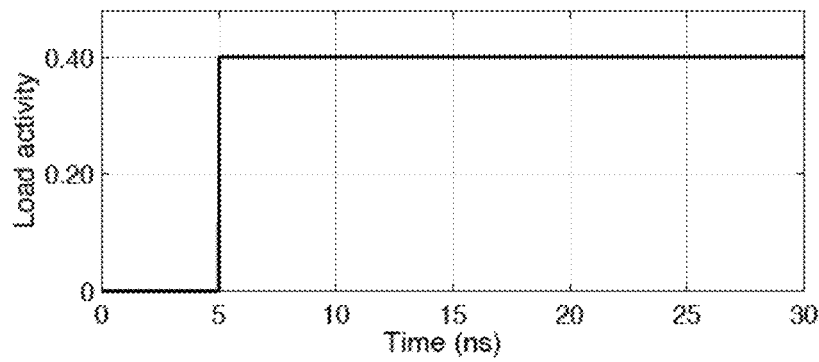
FIGS. 5A, 5B, and 5C show impulse of the load current simulated on the switched capacitor load circuit: 5A—Controlling bit sequence implemented as a step function; 5B—Resulting impulse of load current (Iload), the discharging current from the decap (ICAP), and the current through the voltage source (IPDN), 5C—On-chip voltage response to the impulse current.
Figure 5B:
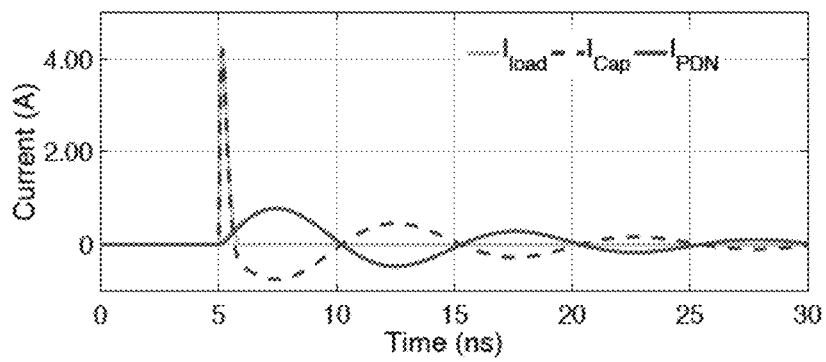
Figure 5C:
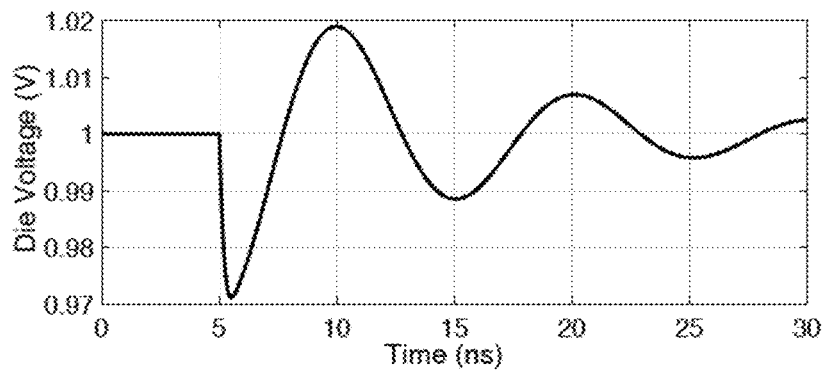

An emulated load current is controlled by an applied bit sequence to a single pole double throw switch, which results in a set charge and discharge time of the switching capacitance CLoad. A current impulse is generated by the bit sequence shown in FIG. 5A. The current consumed by the load, the current delivered by the on-chip capacitance, and the current supplied by the voltage source are shown in FIG. 5B. The onchip voltage variation due to the dynamic current consumption is shown in FIG. 5C. The maximum voltage droop on the on-chip PDN is 29 mV, which is within 7% of the theoretical calculation of 31 mV given by Equation (5). The 2 mV difference (reduction) from the theoretical calculation is due to the charge delivered through the PDN inductance.

$$\Delta V_{droop} = \frac{I_{dynamic}}{f_{clock} \cdot C_{odc}} \tag{5}$$

B. Power Supply Noise Suppression Using Hyperabrupt Junction Diodes

The power supply voltage droop may be reduced by increasing the amount of decoupling capacitance as the current delivered through the PDN lags the instantaneous impulse current demanded by the load. If the total capacitance is also a function of the applied voltage, the dependence of the voltage across the capacitor on the charge drawn from the capacitor is no longer linear. The behavior of the hyperabrupt varactor diode is mathematically described in this section, characterizing the power supply noise suppression the varactor provides when an impulse load current is induced on a clock edge. The corresponding change in the charge of a capacitor for a voltage changing from Vi to Vf is given by Equation (6). Similarly, the change in the charge of a reverse biased hyperabrupt varactor diode for a voltage changing from Vi to Vf is given by Equation (7). The capacitance as a function of the applied reverse bias voltage is given by Equation (1). Therefore, after substituting for C(V), the change in the charge of a hyperabrupt junction varactor is mathematically expressed as Equation (8).

$$\Delta Q_{capacitor} = C \cdot \int_{V_i}^{V_f} dV \tag{6}$$

$$\Delta Q_{varactor} = \int_{V_i}^{V_f} C(V) dV \tag{7}$$

$$\Delta Q_{varactor} = \frac{C_{J0} \cdot V_J^M}{(1-M)} \cdot ((V_f + V_J)^{1-M} - (V_i + V_J)^{1-M}) \tag{8}$$

For an initial voltage Vi of VDD, the voltage droop across the capacitor when ΔQ charge is required by the load is given by Equation (9) and for a hyperabrupt junction varactor diode by Equation (10). Using Equation (5), the voltage droop of a 48.45 nF on-chip decoupling capacitor is 31 mV for a load sinking 1.55 nC of charge per clock cycle. The characteristics of a hyperabrupt varactor diode may be analyzed for varying junction potential VJ and associated grading coefficient M to limit the voltage droop varactor VJ and M is shown through the bottom surface plot in FIG. 6. A junction potential VJ greater than 1 V and a grading coefficient M greater than 2 results in a lower voltage droop than a MIM capacitor with capacitance equal to that offered by a hyperabrupt junction varactor diode at a reverse bias voltage of VDD (1 V).

$$V_{droop\_cap} = \frac{\Delta Q_{capacitor}}{C} \tag{9}$$

$$V_{droop\_varactor} = \tag{10}$$
$$(V_{DD} + V_J) - \left(\frac{\Delta Q_{varactor} \cdot (1-M)}{C_{J0} \cdot (V_J)^M} + (V_{DD} + V_J)^{(1-M)}\right)^{\frac{1}{1-M}}$$

Figure 7:
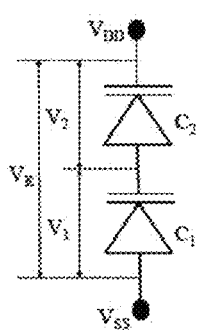
FIG. 7 shows two series-connected hyperabrupt junction diodes for on-chip power supply droop mitigation.

The results indicate that circuit topologies using hyperabrupt varactor diodes to suppress power supply variation due to random load current demand provide benefit. One topology that efficiently suppresses on-chip voltage droop is a series connection of two hyperabrupt varactor diodes, as shown in FIG. 7. The two series-connected varactor diodes are placed as on-chip capacitors close to the load. At steady state, the voltage across the two varactors C1 and C2 is V1 and V2, respectively. In the event of a charge pulled by the load circuit, the amount of charge provided by both varactors is equal, as given by Equation (11). If the final voltage across the varactors C1 and C2 is Vx and Vy, respectively, then the voltage droop across the series connected varactors and the load circuit is given by Equation (12). In these equations, $$\Delta Q_{varactor} = \int_{V_1}^{V_x} C_1(V) dV = \int_{V_2}^{V_y} C_2(V) dV \tag{11}$$

$$V_{droop\_varactor} = V_{DD} - (V_x + V_y) = \tag{12}$$
$$V_{DD} - \left(\left(\frac{\Delta Q_{varactor} \cdot (1-M)}{C_{J0} \cdot (V_J)^M} + (V_1 + V_J)^{(1-M)}\right)^{\frac{1}{1-M}} + \right.$$
$$\left.\left(\frac{\Delta Q_{varactor} \cdot (1-M)}{C_{J0} \cdot (V_J)^M} + (V_2 + V_J)^{(1-M)}\right)^{\frac{1}{1-M}}\right) + 2 \cdot V_J$$

Figure 6:
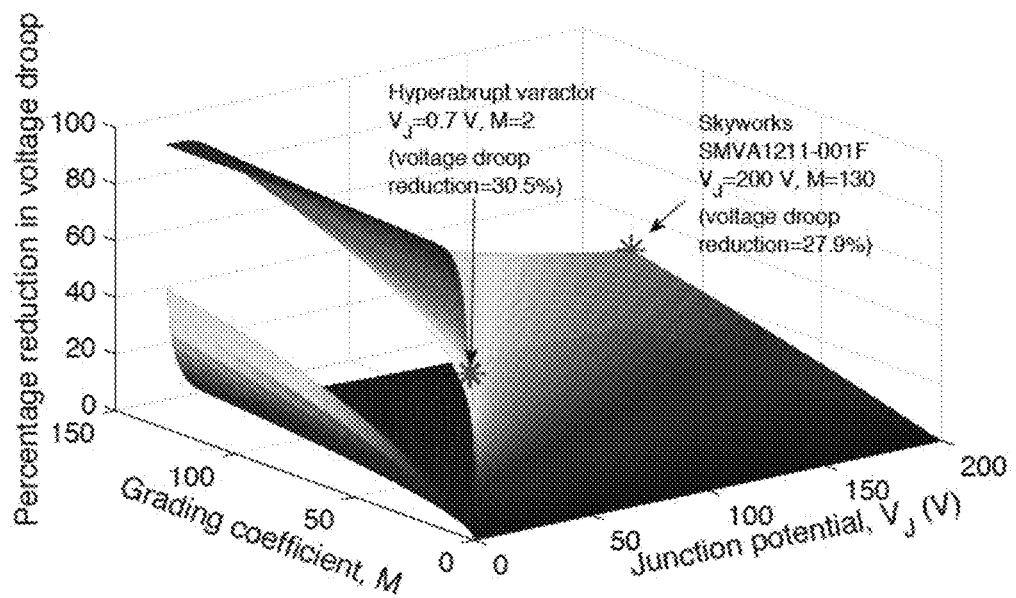
FIG. 6 shows a characterization of a hyperabrupt varactor for variation in the junction potential and the grading coefficient. The bottom surface plot is from the characterization of a single varactor, whereas the top surface plot is the result of the characterization of two series-connected hyperabrupt junction diodes with a topology as shown in FIG. 7.
Figure 8:
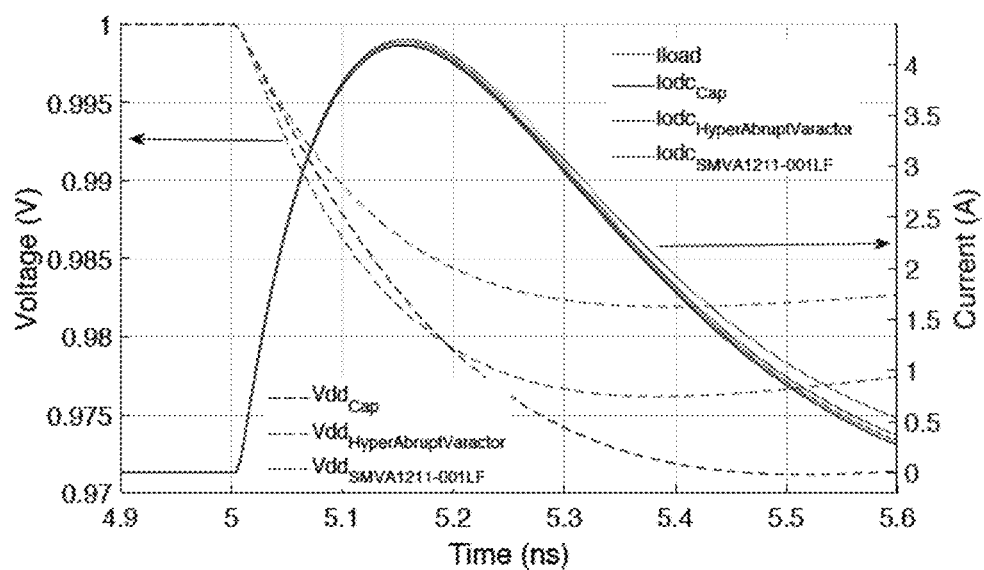
FIG. 8 shows voltage droop due to impulse load current generated on the rising edge of the clock. Three on-chip capacitance scenarios are simulated: ideal capacitor, SMVA-001LF hyperabrupt varactor, and custom hyperabrupt varactor (VJ=0.7 V and M=2).

The additional reduction in voltage droop with two identical series connected hyperabrupt varactor diodes as compared to a 48.45 nF decoupling capacitor is shown through the top surface plot in FIG. 6. The total series capacitance provided by the hyperabrupt junction diodes at a reverse bias voltage of VDD is 48.45 nF. SPICE simulation is run on the switched capacitor load model shown in FIG. 4 to determine the voltage droop for a range of junction potentials VJ and grading coefficients M. Limited by the current fabrication of the steep doping profiles for hyperabrupt junction diodes, a more than 20% reduction in voltage droop due to clock edge induced impulse current is possible as compared to current MIM decoupling capacitors. The benefits of hyperabrupt junction varactors on noise suppression are shown through the percentage reduction in voltage droop achieved for a commercially available SMVA001LF and a custom Verilog-A implementation (junction potential VJ of 0.7 V and grading coefficient M of 2) of the hyperabrupt junction diode as marked on the top surface plot shown in FIG. 6. The corresponding SPICE simulations for the clock edge induced power supply noise with two series connected hyperabrupt varactors is shown in FIG. 8.

The greater the number of identical hyperabrupt varactor diodes connected in series, the smaller is the voltage droop across the series connected diodes. To simplify the mathematical analysis, N identical hyperabrupt varactor diodes are considered. The initial voltage across each of the N series connected varactors is VDD/N. The final voltage across each of the N diodes, after a discharge event due to an instantaneous change in the load current, is Vx. The voltage droop across the N series connected hyperabrupt varactor diodes is given by Equation (13), which is an extension of the voltage droop computed for two series connected varactor diodes determined through Equation (12).

$$V_{droop\_varactor} = V_{DD} - N \cdot V_x = \qquad (13)$$

$$V_{DD} + N \cdot V_J - N \cdot \left( \frac{\Delta Q_{varactor} \cdot (1-M)}{C_{J0} \cdot (V_J)^M} + (V_1 + V_J)^{(1-M)} \right)^{\frac{1}{1-M}}$$

Figure 9:
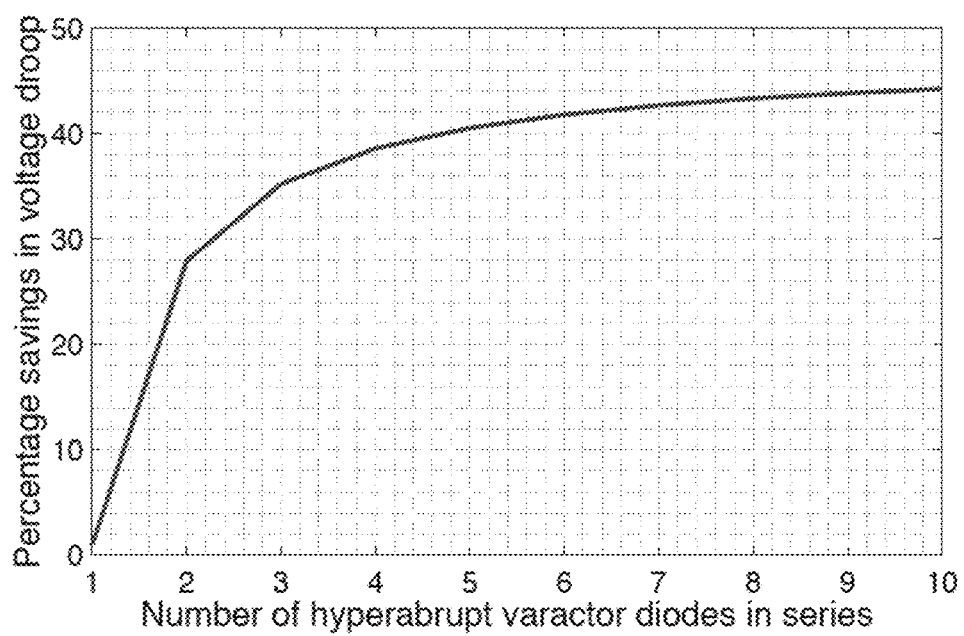
FIG. 9 shows percentage savings in the power supply droop with an increasing number of hyperabrupt varactors connected in series. A total capacitance of 48.45 nF is maintained for all the configurations of the varactors. The percentage savings is in comparison with a voltage droop of 31 mV for an on-chip capacitance of 48.45 nF.

The analysis of the voltage droop on the power network performed for two series connected hyperabrupt varactors is extended to N series connected hyperabrupt varactor diodes with a combined capacitance of 48.45 nF. The percentage reduction in the voltage droop as compared to a decoupling capacitor of 48.45 nF is shown in FIG. 9. The SPICE parameters of the SMVA1211-001LF (VJ of 200 and M of 130) are considered for each of the hyperabrupt varactors connected in series, where the N series connected hyperabrupt varactors provide decoupling capacitance to the switched capacitor load circuit shown in FIG. 4.

The percentage savings in the voltage droop increases as the number of hyperabrupt varactor diodes connected in series increases. The rate of increase diminishes beyond six series connected diodes. Due to the limitations in on-chip area allocated to decoupling capacitors, a trade off needs to be made for number of series connected hyperabrupt varactor diodes used for power supply noise suppression.

Given the substantial reduction achieved in voltage droop, a detailed analysis on power supply noise suppression through two series connected hyperabrupt junction varactor diodes was performed as described in Section IV.

IV. Spice Simulations of Power Supply Noise

The efficacy of series-connected hyperabrupt varactor diodes for on-chip noise suppression may be characterized by simulating different power supply voltage noise scenarios. The voltage noise on the power supply is a function of the time domain (transient) on-chip current consumption and the frequency domain PDN impedance characteristics. A power delivery network model may be constructed with an optimized impedance profile, such that the characteristic impedance of the peaks caused by the parallel resonances of the various components of the PDN are minimized. The transient changes of the current hat induce the maximum variation in the power supply voltage on the optimized PDN are simulated for 1) a step up in activity after exiting a power down mode and 2) a resonating event on-chip capacitance and package inductance. The suppression of the power supply voltage noise when using hyperabrupt junction diodes is compared with the suppression due to conventional on-chip capacitors.

A. Construction of the Power Distribution Network

Power delivery to CMOS circuits through off-chip DC-DC regulators may result in a PDN with a complex impedance profile. The impedance as a function of frequency exhibits three distinct peaks roughly separated by a decade in frequency. The impedance peaks are due to the resonance between 1) the voltage regulator module (VRM) and the bulk capacitors mounted near the VRM, 2) the loop inductance of the bulk capacitors and the ceramic capacitors mounted on the PCB, and 3) the loop inductance of the ceramic capacitors, package lead inductance, and the on-chip capacitance. The impedance peak due to the resonance between the package inductance and on-chip capacitance has the largest magnitude and is described as the Bandini mountain. The larger the magnitude of the Bandini mountain at a given resonance frequency, the greater the power supply noise experienced when a transient load current is excited at a frequency close to the resonance frequency of the PDN. Reducing the magnitude of the Bandini mountain is possible by increasing the on-chip capacitance or minimizing the parasitic inductance of the package and the inductance of the multi-layered ceramic capacitors mounted on the PCB.

Figure 10:
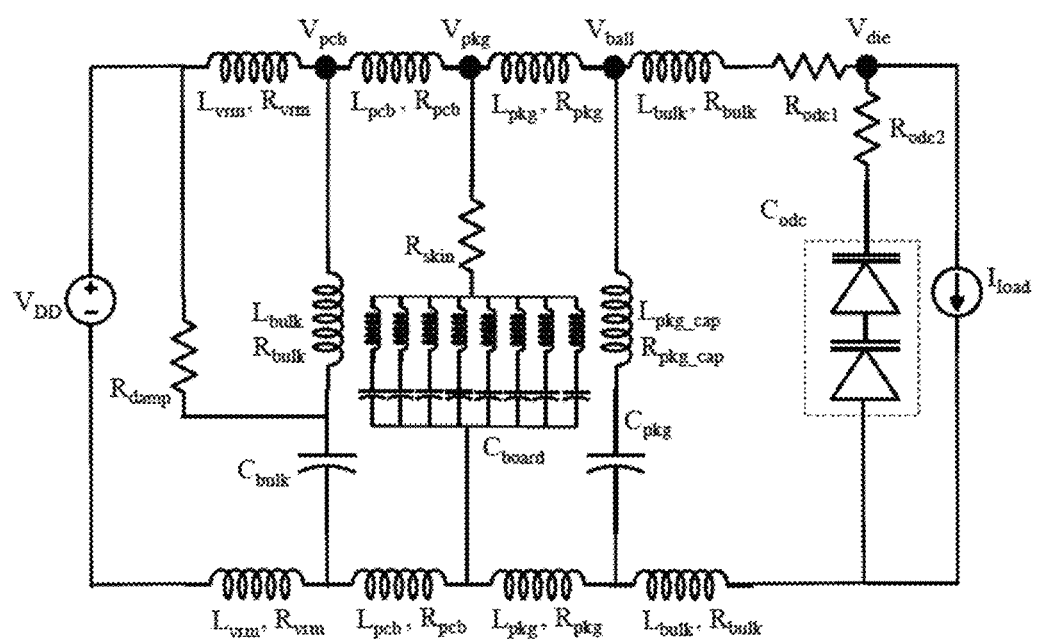
FIG. 10 shows a schematic of the optimized power distribution network with distributed multilayer ceramic capacitors mounted on the PCB and package capacitors.
Figure 11:
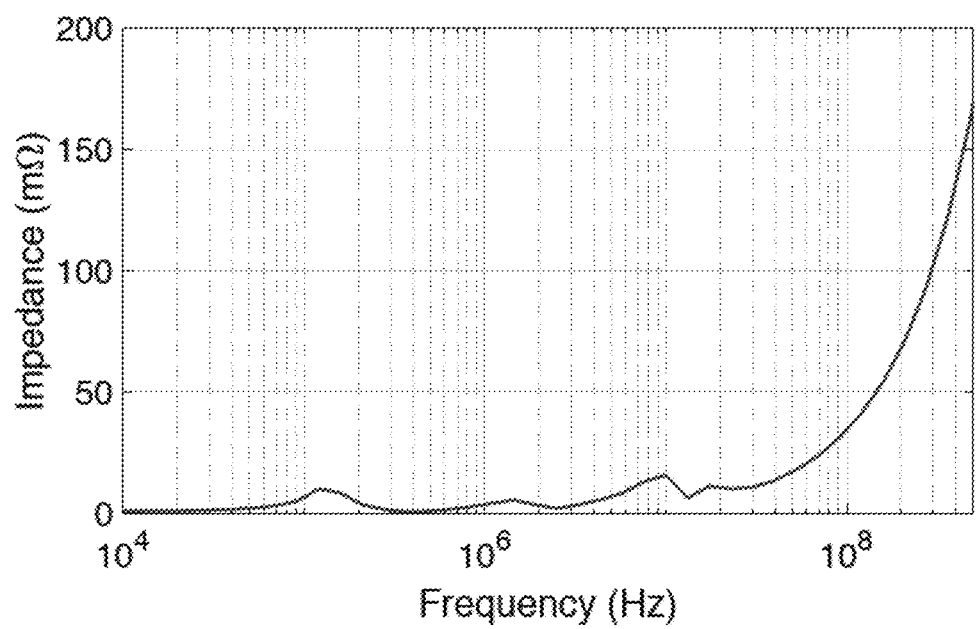
FIG. 11 shows the impedance profile of the optimized power distribution network. Due to improved modeling of the voltage regulator, distributed multilayer ceramic capacitors on the PCB, and on-package capacitors, the impedance peaks at low- and mid-frequency resonance are minimized.
Figure 12:
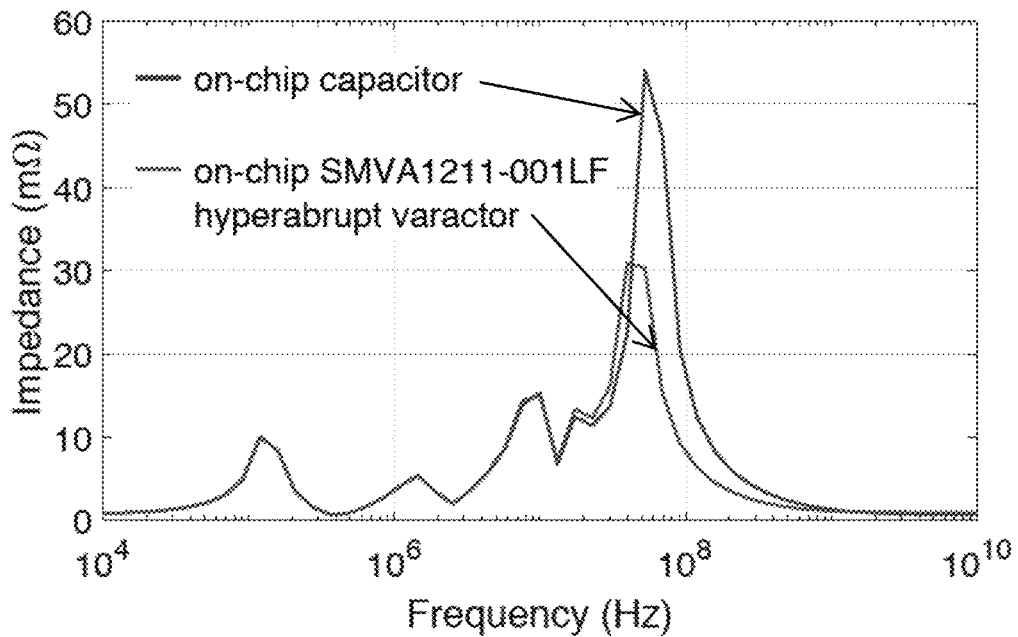
FIG. 12 shows impedance profile of the power distribution network with on-chip capacitance Codc and associated effective series resistance Rodc. The impedance profile with an ideal on-chip capacitor (darker curve) and a series connected SPICE model of a hyperabrupt junction diode (lighter curve) is plotted.

A PDN model may be, therefore, constructed with an impedance profile that minimizes the magnitude of the Bandini mountain for a given maximum on-chip load current. On-package capacitors are added to the model of the PDN. The effective series inductance of the on-package capacitors reduce the C4 bump loop inductance that resonates with the on-chip capacitance, which reduces the height of the Bandini mountain. Ten distributed multi-layer ceramic capacitors are added to suppress the second impedance peak. The impedance peak caused by the VRM may be minimized by connecting a shunt resistor, which is present but often ignored when modeling the VRM, between an ideal voltage source and the bulk capacitor. The circuit schematic of the optimized PDN is shown in FIG. 10, and the components used to construct the PDN are listed in Table III. The impedance profile of the optimized PDN from the VRM up to the C4 bumps is shown in FIG. 11. The low frequency and mid frequency resonance peaks occur at 120 KHz and 10 MHz, respectively. The impedance of the PDN is then determined by considering an on-chip capacitance of 100 nF. The impedance profiles from SPICE simulation are shown in FIG. 12 for a PDN with an ideal on-chip capacitance and a PDN with an on-chip implementation of two series connected hyperabrupt junction diodes each with a total capacitance Codc of 100 nF and a reverse bias voltage of VDD (for the hyperabrupt diodes).

TABLE III

Components of the optimized PDN [2].

| Parameter | Value |
| --- | --- |
| $R_{damp}$ | 10 mΩ |
| $L_{vrm}$, $R_{vrm}$ | 5 nH, 0.1 mΩ |

TABLE III-continued

Components of the optimized PDN [2].

| Parameter | Value |
| --- | --- |
| $L_{pcb}$, $R_{pcb}$ | 48 pH, 0.485 mΩ |
| $L_{bulk}$, $R_{bulk}$ | 510 pH, 1.365 mΩ |
| $C_{bulk}$ | 132 μF |
| $L_{pkg}$, $R_{pkg}$ | 19 pH, 0.123 mΩ |
| $C_{board}$ | 22 nF, 10 μF, 2.2 μF (2x), 2 μF, 440 nF (2x), 100 nF, 4.7 μF, 940 nF |
| $L_{bump}$, $R_{bump}$ | 9.5 pH, 0.1 mΩ |
| $L_{pkg\_cap}$, $R_{pkg\_cap}$ | 104 pH, 15.72 mΩ |
| $C_{pkg}$ | 440 nF |
| $R_{odc1}$, $R_{odc2}$ | 1.5 Ω, 1 Ω |
| $C_{odc}$ | 100 nF |

B. Transient Current Waveforms for Analysis of Power Supply Noise

The constructed PDN model is used to characterize the effect that transient current waveforms have on the power supply voltage. The voltage variation on the power supply due to an impulse current on a clock edge has been described in Section III-B. The other two transient current waveforms of interest are 1) the step and 2) the resonant square wave. SPICE simulations are performed with both waveforms applied to the optimized PDN described in Section IV-A. The on-chip capacitance considered for the SPICE simulations is 100 nF. The parasitic resistance contributed by the on-chip capacitor is represented by Rodc1 and Rodc2 (refer to Table III). The two transient current waveforms are applied to three circuit scenarios: 1) an ideal 100 nF capacitor, 2) a Verilog-A model of a hyperabrupt junction diode with junction voltage VJ of V and grading coefficient M of 2, and 3) a SPICE model of the hyperabrupt junction diode SMVA1211-001LF. Two series connected hyperabrupt junction diodes are considered with a total capacitance of 100 nF at a reverse bias voltage of 1 V (VDD).

Figure 13:
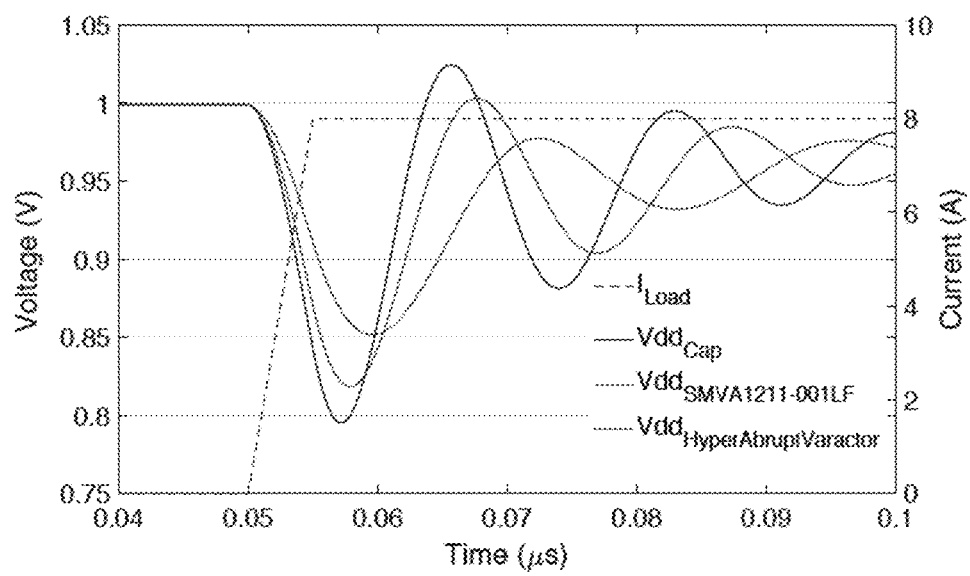
FIG. 13 shows voltage droop due to an 8 A impulse load current.

Voltage response to current step: The load current Iload, as shown in FIG. 13, is switched from 0 to 8 A in ten clock cycles. A rise time of ten clock cycles is a reasonably aggressive assumption for digital circuits with pipelined architectures where the switching activity increases linearly with each clock cycle. The response of the on-chip supply voltage to a load current emulated as a current step waveform is shown in FIG. 13. With an ideal on-chip capacitance of 100 nF, the power supply voltage droops by 205 mV. With the series connected SPICE model parameters of the Skyworks SMVA1211-001LF, the maximum voltage droop is 181 mV. With the series connected Verilog-A model of the hyperabrupt junction diodes, the maximum voltage droop to an 8 A step current is 149 mV. The series configuration of hyperabrupt varactors as on-chip decoupling capacitors, therefore, offers an 11.7% to 27.3% reduction in the voltage droop as compared to an ideal on-chip capacitance of the same value.

2) Voltage response to resonating current: The Bandini peak for the optimized PDN with 100 nF of on-chip decoupling capacitance occurs at a resonant frequency of 50 MHz. A repeating load current at a frequency of 50 MHz with 8 A transients is applied as shown in FIG. 14. The time domain response of the power supply voltage to the resonating current for the three on-chip capacitance models is also shown in FIG. 14. With an ideal on-chip capacitance of 100 nF, the power supply voltage fluctuates by 370 mV on either side of the 1 V nominal supply voltage. With the series connected SPICE model of the SMVA1211-001LF, the maximum voltage fluctuation is +/−320 mV. With the series connected Verilog—A model of the hyperabrupt junction diodes, the maximum voltage fluctuation to an 8 A resonating current is +/−160 mV.

The high frequency noise caused by the resonance between the on-chip capacitance and the low impedance interconnection between the die and the package is, therefore, suppressed by up to 57% with the series connected hyperabrupt varactors implemented as on-chip decoupling capacitors.

Figure 4:
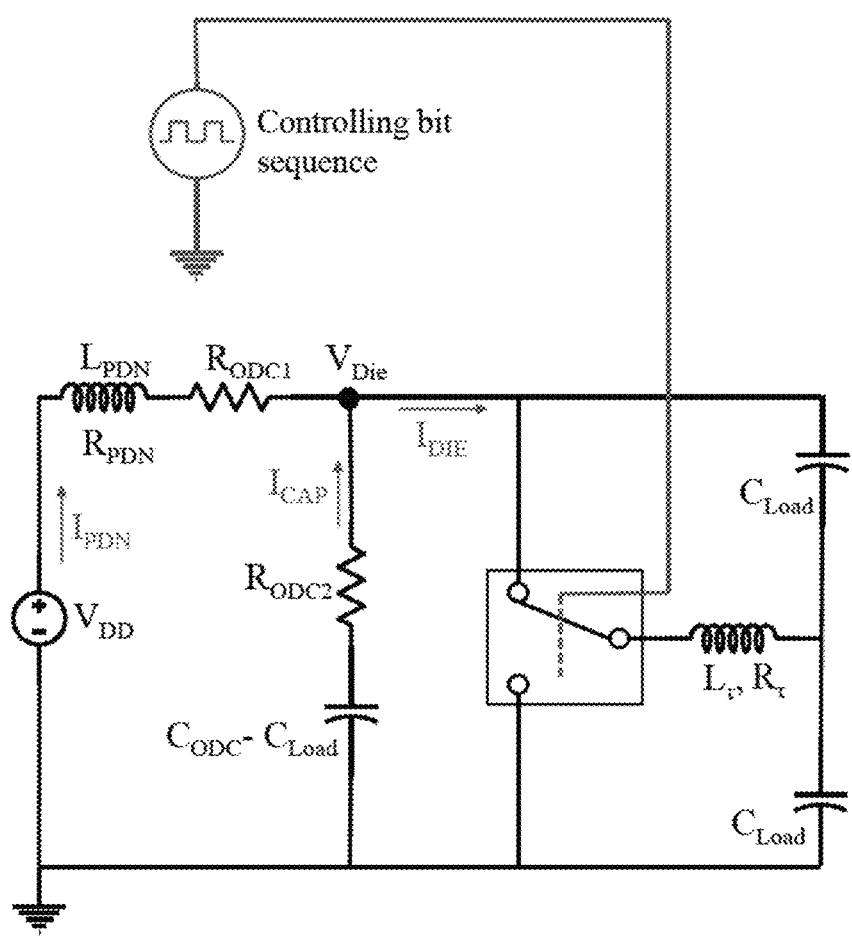
FIG. 4 shows switched capacitor load circuit to emulate the switching behavior of clock-edge-triggered CMOS circuits. The power supply voltage is applied to a PDN with a characteristic impedance equal to the target impedance.

The efficacy of hyperabrupt junction diodes to suppress high frequency noise is demonstrated for a switched capacitor load circuit, which better emulates the load current consumption of CMOS circuits (refer to FIG. 4). The activity pattern applied to the switched capacitor load circuit is shown in FIG. 15A. The load current Iload is used to characterize the current delivered by the three on-chip capacitance configurations; 1) the current ICap from an ideal capacitor, 2) the current IHyperAbruptV aractor from a series connected VerilogA model of the hyperabrupt varactor with VJ of 0.7 V and M of 2, and 3) the current ISMV A1211-001LF from a series connected SMVA1211-001LF, along with the current IP DN sunk from the PDN for each configuration, are shown, respectively, in FIGS. 15C, 15D, and 15E. The 100 mV undershoot and overshoot (20% of VDD) when using an onchip capacitor are suppressed to an 80 mV undershoot and 60 mV overshoot when implementing the SMVA1211-001LF and a 40 mV overshoot and undershoot (8% of VDD) with the custom Verilog-A implementation of the hyperabrupt junction diode. The high frequency resonance noise is, therefore, reduced by up to 60% with the hyperabrupt junction varactors.

V. Comparison with Existing Power Supply Noise Mitigation Techniques

In this section, existing on-chip power supply noise mitigation techniques are compared with the proposed implementation using on-chip series connected hyperabrupt junction diodes. Techniques to suppress high frequency noise are considered, which is most critical for on-chip power integrity and broadly consist of power supply noise detection and reaction schemes. Early examples of such techniques applied to onchip power distribution in commercial microprocessors are known to those of skill in the art. A power supply droop detection circuit is used to trigger a switched capacitor network, such that the voltage increases through the series combination of the decoupling capacitors. The on-chip power consumption may be monitored and in the event of voltage overshoot or undershoot, the current consumed by the load is controlled to limit the variation in power supply voltage. A PDN conditioner implemented with a large capacitor connected to a high voltage rail may be done as known. The voltage undershoot and overshoot are detected through voltage slope detection circuits. In the event of a voltage droop, a large capacitance charged by a higher voltage rail (greater than 1.5 times VDD) is connected to the VDD rail. Such methods suffer from latency and circuit overhead due to the detection circuits used to monitor power supply variation.

Figure 16A:
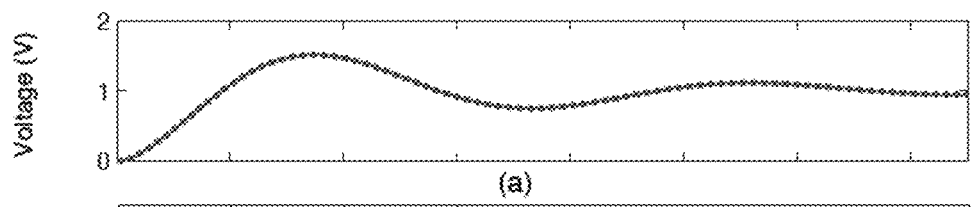
FIGS. 16A-16C show energy overhead of introducing additional on-chip decoupling capacitance to obtain the same power supply noise suppression as series connected hyperabrupt junction diodes and characterization of 16A on-chip voltage variation as the decaps are charged at power up, 16B current sunk from the dc-dc regulator at power-up through the optimized PDN by the on-chip decoupling capacitance, and 16C cumulative energy consumed during powerup for the overcompensated on-chip capacitance of 200 nF normalized to the cumulative energy consumed with 100 nF of series-connected hyperabrupt varactor diodes.
Figure 16B:
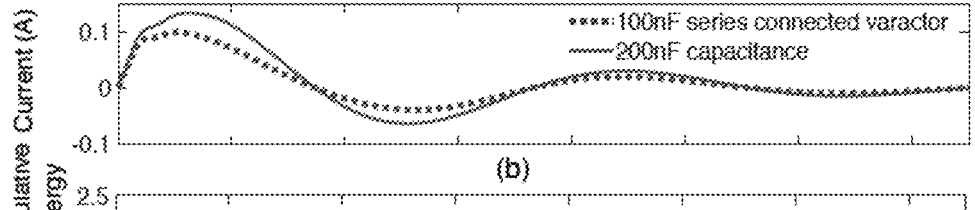
Figure 16C:
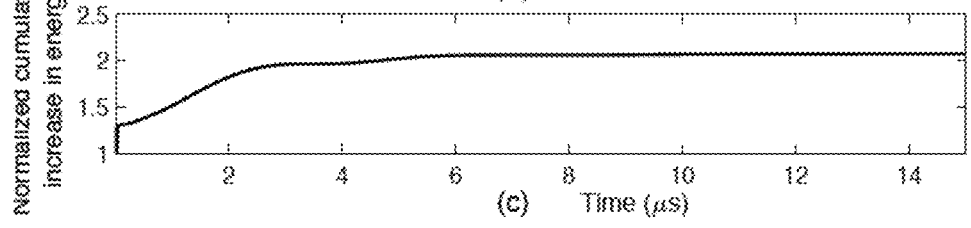

The design properties listed in FIG. 17, Table IV for existing onchip capacitors are compared with a hyperabrupt junction diode for noise decoupling applications. Note that the leakage current of hyperabrupt junction diodes may be inferior to standard decoupling capacitors, where the leakage is a strong function of the operating temperature. The capacitance density is dependent on the P-N junction contact area and is extracted from experimental measurements made according to known methods. If the on-chip area is not a constraint, the same amount of voltage noise suppression as obtained from the series connected hyperabrupt varactor diodes is obtained with on-chip decoupling capacitors of twice the capacitance (200 nF). However, increasing the on-chip capacitance results in a degradation in the energy efficiency of the circuit. Two circuit configurations are simulated to illustrate the tradeoff in on-chip area devoted to decoupling capacitance. The first configuration includes the series connected SMVA1211 varactor diodes with a total capacitance of 100 nF. The second configuration includes 200 nF of on-chip capacitance, an increase of 100 nF to obtain the same amount of power supply noise suppression as the 100 nF varactor diodes. Although the noise suppression achieved for a step load current of 8 A (refer to FIG. 13) may be the same for the two on-chip configurations, the large on-chip capacitance of 200 nF is charged on every power up cycle of the device. With voltage shown in FIG. 16A, the current required to charge the 200 nF capacitance as compared to the 100 nF varactor diodes is shown in FIG. 16B. The increase in charge consumed on each power cycle or exit from low power state increases the energy consumption of the circuit, which reduces the energy efficiency. For a single power-on event, the cumulative energy consumption to charge the 200 nF on-chip capacitance, normalized with respect to the cumulative energy consumption for the 100 nF series connected hyperabrupt varactor diodes, is shown in FIG. 16C. Despite the larger on-chip area needed to implement series connected hyperabrupt diodes, the energy efficiency of the circuit is greater for the same amount of power supply noise suppression as achieved by deep trench decoupling capacitors.

The use of adaptive clocking to suppress power supply noise is a recent and popular technique in high performance processors. The technique consists of noise detection and reaction circuits. The reactive component consists of modifying the system clock frequency to negate any timing violations that occur on the critical path of the load circuit when the power supply voltage droops. The voltage droop increases the delay in a digital circuit and a proportional decrease in clock frequency is required to meet the timing constraints. In [24], the magnitude of the voltage droop is reduced by 17% through adaptive clocking for a step current synchronized across all cores in a 14 nm, 24 core POWER9 processor. In addition to the noise detection latency, adaptive clocking methods incorporate additional delay when the clock frequency is adjusted, including the latency of the modified clock propagating through the clock tree. As known b, y a person of skill in the art, for a 28 nm dual-core Cortex-A57 cluster operating at 1.1 GHz and 1 V, a clock adaptation latency of less than 2 ns is required to significantly reduce voltage droop without compromising circuit performance.

Implementing the on-chip decoupling capacitors as series connected hyperabrupt junction diodes not only achieves higher suppression in power supply noise as compared to adaptive clocking or other switched decoupling capacitor methods but also achieves noise suppression with minimal impact to latency and performance. In addition, detection of a noise event is not needed, which is a requirement with all existing noise mitigation techniques. Determining the correct triggering instant is a challenge as a late trigger diminishes the maximum possible droop mitigated (and therefore the reduction in voltage margin) and an early trigger potentially impacts performance if the droop is not large. When compared with the complete power supply noise mitigation circuitry (decoupling capacitors, MOS switches, voltage/timing margin detection circuits, adaptive frequency DPLL/PLL circuits), the on-chip series connected implementation of the hyperabrupt junction diode is advantageous to reduce voltage margins while trading off on-chip area and leakage power consumption.

VI. CONCLUSION

Varactors with high capacitance tuning ratios such as the hyperabrupt junction diode are described for on-chip power supply noise suppression for noise sensitive digital blocks. The increase in capacitance as the voltage across the varactor drops is exploited to reduce the dependence of the voltage across the varactor terminals on the charge stored or released from the varactor. For the same amount of charge drawn, the voltage drop across series connected hyperabrupt junction diodes may be less than a MIM or deep trench capacitor with the same capacitance. The reduction in the variation of the power supply voltage with on-chip hyperabrupt junction diodes is simulated with a current model that includes an optimized power delivery network for high frequency resonance, a step current, and a clock edge induced current. The three current waveforms are used to characterize the stability of the PDN. The proposed circuit technique with a commercially available hyperabrupt junction diode and with a custom hyperabrupt junction diode implemented with a junction voltage VJ of 0.7 V and grading coefficient M of 2, show, respectively, up to 40% and 60% reduction in the peak magnitude of high frequency power supply voltage noise as compared to current on-chip decoupling capacitors. The efficacy of the proposed noise suppression technique is demonstrated for the same amount of on-chip decoupling capacitance. In addition, there is no performance penalty or additional circuitry needed as compared to existing power supply noise mitigation techniques found in commercial processors and literature.

While the invention has been described with reference to the embodiments above, a person of ordinary skill in the art would understand that various changes or modifications may be made thereto without departing from the scope of the claims.

The invention claimed is:

1. A hyperabrupt varactor diode comprising:
   an anode;
   a diode and a capacitor connected in parallel to the anode, wherein the diode includes a variable-series resistor in series with a variable conjunction capacitor; and
   a cathode connected to the parallel-connected diode and capacitor; and
   an inductor in series between the anode and the parallel connected diode and capacitor.

2. The hyperabrupt varactor diode of claim 1, wherein the inductor and capacitor form an on-chip interconnector.

3. The hyperabrupt varactor diode of claim 1, comprising a P-N junction with a heavily doped P side.

4. The hyperabrupt varactor diode of claim 1, wherein variation of a doping concentration on an N side of the P-N junction sets the feasible capacitance range of the varactor as a function of reverse bias voltage.

5. The hyperabrupt varactor diode of claim 4, wherein the doping concentration on the N side is mathematically expressed as $Nd \alpha x^{-m}$ for $x>0$, where x is the distance from the junction and m is a constant that describes the type of P-N junction, wherein for an abrupt varactor and linearly graded varactor, m is 0 and 1, respectively.

6. The hyperabrupt varactor diode of claim 5, wherein the m value for a hyperabrupt varactor is between −1.2 to −2, wherein there is a rapid reduction in charge concentration as the distance from the P-N junction increases, thereby creating a retrograde dopant profile with the dopant concentration exhibiting a steep slope near the diffusion region.

* * * * *